United States Patent
Chiang et al.

(10) Patent No.: US 10,700,125 B2
(45) Date of Patent: Jun. 30, 2020

(54) INTEGRATED SYSTEM CHIP WITH MAGNETIC MODULE

(71) Applicant: Taiwan Semiconductor Manufacturing Co., Ltd., Hsin-Chu (TW)

(72) Inventors: Katherine H. Chiang, New Taipei (TW); Chung-Te Lin, Tainan (TW); Min Cao, Martinez, CA (US); Han-Ting Tsai, Kaoshiung (TW); Pin-Cheng Hsu, Zhubei (TW); Yen-Chung Ho, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/416,529

(22) Filed: May 20, 2019

(65) Prior Publication Data

US 2020/0105830 A1 Apr. 2, 2020

Related U.S. Application Data

(60) Provisional application No. 62/738,095, filed on Sep. 28, 2018.

(51) Int. Cl.
*H01L 27/22* (2006.01)
*H01L 43/10* (2006.01)
*H01L 43/02* (2006.01)

(52) U.S. Cl.
CPC .......... *H01L 27/224* (2013.01); *H01L 27/228* (2013.01); *H01L 43/02* (2013.01); *H01L 43/10* (2013.01)

(58) Field of Classification Search
CPC ..... H01L 27/224; H01L 43/10; H01L 27/228; H01L 43/02
USPC .......................................................... 257/427
See application file for complete search history.

(56) References Cited

U.S. PATENT DOCUMENTS

| | | | |
|---|---|---|---|
| 10,032,978 B1 * | 7/2018 | Schabes | H01L 43/08 |
| 2009/0243008 A1 * | 10/2009 | Kitagawa | H01L 27/222 |
| | | | 257/421 |
| 2016/0043306 A1 * | 2/2016 | Huang | H01L 43/08 |
| | | | 257/427 |
| 2016/0254046 A1 * | 9/2016 | Ranjan | G11C 11/5607 |
| | | | 257/427 |
| 2018/0358547 A1 * | 12/2018 | Yang | H01L 43/12 |
| 2019/0157344 A1 * | 5/2019 | Wei | H01L 27/222 |

* cited by examiner

*Primary Examiner* — Caleen O Sullivan
(74) *Attorney, Agent, or Firm* — Eschweiler & Potashnik, LLC

(57) ABSTRACT

The present disclosure relates to magnetic memory device. The magnetic memory device includes a bottom electrode, a selector layer disposed over the bottom electrode, and a MTJ stack disposed over the selector layer and comprising a reference layer and a free layer disposed over the reference layer and separated from the reference layer by a tunneling barrier layer. The magnetic memory device further includes a modulating layer disposed over the MTJ stack and a top electrode disposed over the switching threshold modulating layer. The selector layer is configured to switch current on and off based on applied bias.

20 Claims, 7 Drawing Sheets

200a

200b

INTEGRATED SYSTEM CHIP WITH MAGNETIC MODULE

REFERENCE TO RELATED APPLICATION

This Application claims the benefit of U.S. Provisional Application No. 62/738,095, filed on Sep. 28, 2018, the contents of which are hereby incorporated by reference in their entirety.

BACKGROUND

Many modern day electronic devices contain electronic memory. The electronic memory includes hard disk drives and random access memories (RAMs). A random access memory may be a volatile memory where the stored data is lost in the absence of power or a non-volatile memory which stores data in the absence of power. Dynamic random access memory (DRAM) and static random access memory (SRAM) are two typical kinds of volatile memory. Flash memory was widely used as non-volatile memory. Resistive or magnetic memory devices including magnetic tunnel junctions (MTJs) can be used in hard disk drives and/or RAM, and are promising candidates for next generation memory solutions due to relative simple structures and their compatibility with complementary metal-oxide-semiconductor (CMOS) logic fabrication processes. Currently, these different kinds of memories are prepared in different chips and implemented in a single module by advanced packaging methods such as system in package (SiP) or multi-chip module techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
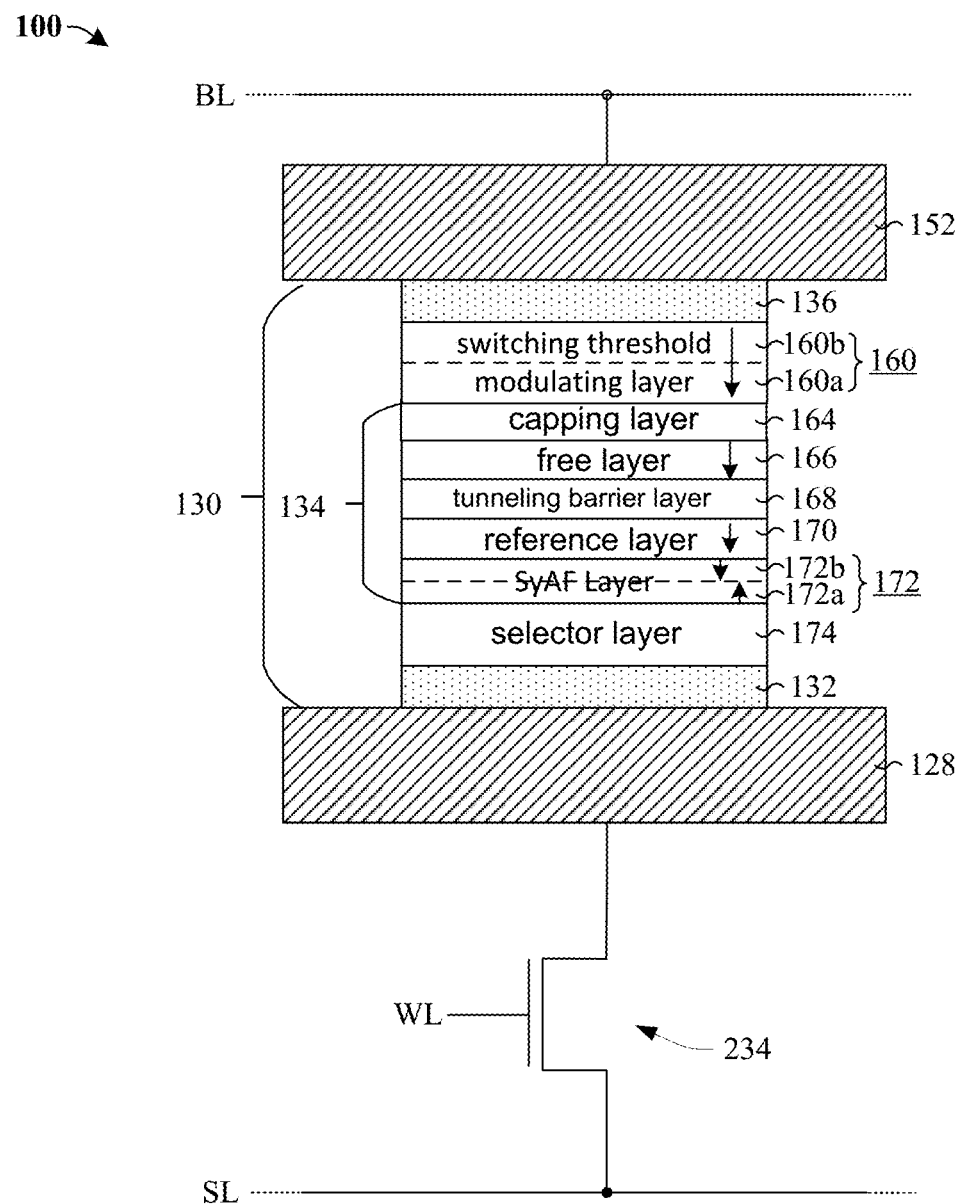
FIG. 1 illustrates a cross-sectional view of a magnetic memory device including a magnetic tunneling junction (MTJ) stack including a modulating layer according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an electronic device, different memory technologies are needed for data storage at different levels of a memory hierarchy. Each technology is optimized toward certain performance matrix. For example, in a computer memory, SRAM may be used for a core cache and a shared cache and may be optimized to get a fast speed; DRAM may be used for on-package memory and may be optimized to get a great density; and a flash memory may be used for on-line storage and may be optimized to get a reliable retention. Those different memories are realized by different technologies and fabricated on separated chips. Memory chips are also separated from logic circuit chips, as the processes for memory and logic circuit components are usually incompatible. Memory chips and logic circuit chips are implemented in a single module (or package) by system in package (SiP), 3-D packaging, or Multi-Chip Module (MCM) techniques. In a module or package, multiple chips with various functions (especially, storage memories) will occupy a large area and consume power. There are cost and performance penalties due to interconnects and packaging.

In view of above shortcomings, the present disclosure provides for an integrated system chip that makes use of compatible tunable magnetic modules for varies storage and circuit needs. According to some embodiments, a plurality of magnetic modules is inserted into a back end of line (BEOL) of an integrated system chip. The plurality of magnetic modules may have different dimensions and/or different compositions to be optimized for different matrix or realize different functions. For example, some magnetic modules may include a modulating layer disposed on one side of an MTJ stack. The modulating layer is tuned differently for optimizing MTJ stacks' switching speed or retention ability. Some magnetic modules may also include a selector layer disposed on the same or the other side of the MTJ stack. The selector layer can control the on/off switch of the MTJ stack. The selector layer can also enable the magnetic modules function as a header/footer switches by tuning the selector layer to have desirable switching threshold. Thus, by inserting and tuning magnetic modules in the interconnect structures of the BEOL of an integrated system chip, varies memory devices and circuit devices can be integrated together in the BEOL. Thereby, power consumption can be reduced significantly.

FIG. 1 shows a cross-sectional view of a magnetic memory device 100 including a tuned magnetic module 130. The tuned magnetic module 130 comprises a modulating layer 160 on one side of a magnetic tunneling junction (MTJ) stack 134 according to some embodiments. The MTJ stack 134 may be disposed between a bottom electrode 132 and a top electrode 136. In some embodiments, the bottom electrode 132 and the top electrode 136 may comprise tantalum (Ta), tantalum nitride (TaN), or ruthenium (Ru), for example. In some embodiments, the MTJ stack 134 comprises a reference layer 170 disposed over the bottom electrode 132 and a free layer 166 disposed over the reference layer 170 and separated from the reference layer 170 by a tunneling barrier layer 168. The reference layer 170 is a ferromagnetic layer that has a magnetization direction that is "fixed". As an example, the magnetization direction of the reference layer 170 can be "up", i.e., perpendicular to the plane of the reference layer 170 pointing to the top electrode 136, as shown in FIG. 1 by the arrow. The tunnelling barrier layer 168, which can manifest as a thin dielectric layer or non-magnetic metal layer in some cases, separates the reference layer 170 from the free layer 166. The tunnelling barrier layer 168 can be a tunnel barrier which is thin enough to allow quantum mechanical tunnelling of current between the reference layer 170 and the free layer 166. In some embodiments, the tunneling barrier layer 168 can comprise an amorphous barrier, such as aluminum oxide ($AlO_x$) or titanium oxide ($TiO_x$), or a crystalline barrier, such as magnesium oxide (MgO) or a spinel (e.g., $MgAl_2O_4$). The free layer 166 and the reference layer 170 can comprise iron, cobalt, nickel, iron cobalt, nickel cobalt, cobalt iron boride, iron boride, iron platinum, iron palladium, or the like. As an example, the free layer 166 and the reference layer 170 may respectively comprise cobalt iron boron (CoFeB) layer. The free layer 166 is capable of changing its magnetization direction between one of two magnetization states, which correspond to binary data states stored in the magnetic memory device 100. For example, in a first state, the free layer 166 can have an "up" magnetization direction in which the magnetization direction of the free layer 166 is aligned in parallel with the magnetization direction of the reference layer 170, thereby providing the MTJ stack 134 with a relatively low resistance. In a second state, the free layer 166 can have a "down" magnetization direction which is aligned and anti-paralleled with the magnetization direction of the reference layer 170, thereby providing the MTJ stack 134 with a relatively high resistance. In some embodiments, the free layer 166 may comprise magnetic metal, such as iron, nickel, cobalt, boron and alloys thereof, for example, such as a CoFeB ferromagnetic free layer.

A synthetic anti-ferromagnetic (SyAF) layer 172 is disposed under the reference layer 170 or at one side of the reference layer opposite to the free layer 166. The SyAF layer 172 is made of ferromagnetic materials having constrained or "fixed" magnetization directions. This "fixed" magnetization direction can be achieved in some cases by an initializing exposure to a high magnetic field after the entire chip is manufactured. As an example, the SyAF layer 172 may comprise a first pair of pinning layers including a first pinning layer 172a and a second pinning layer 172b having opposite magnetization directions aligned with the magnetization direction of the reference layer 170. Using the same example given above, the first pinning layer 172a may have an "up" magnetization direction paralleled with the reference layer 170 and the second pinning layer 172b may have a "down" magnetization direction anti-paralleled with the magnetization direction of the reference layer 170. As an example, the first pinning layer 172a may comprise cobalt layers and nickel layers one stacked above another $(Co/Ni)_m$. The first pinning layer 172a may also be cobalt palladium stack $(Co/Pd)_m$, or cobalt platinum stack $(Co/Pt)_m$, where m can be a positive integer. The second pining layer 172b may comprise the same compositions of the first pining layer 172a with same or different amount of layers. For example, the second pining layer 172b may comprise nickel layers and cobalt layers one stacked above another $(Ni/Co)_n$, or palladium cobalt stack $((Pd/Co)_n$, or platinum cobalt stack $(Pt/Co)_n$, where n can be a positive integer.

On the other side of the reference layer 170 opposite to the SyAF layer 172, a capping layer 164 may be disposed over the free layer 166. The capping layer 164 enhances anisotropy of the free layer 166. As an example, the capping layer 164 may comprises magnesium oxide (MgO).

A modulating layer 160 is disposed over the free layer 166 and opposite to the reference layer 170. The modulating layer 160 may be disposed directly on the free layer 166 (not shown in the figure) or separated from the free layer 166 by the capping layer 164 (as shown in FIG. 1). The modulating layer 160 is configured to modulate the switching threshold of MTJ stack 134 through magnetic or electrical interactions. In some embodiments, the modulating layer 160 may comprise one or more magnetic layers that modulate switching current of the MTJ stack 134. The modulating layer 160 may be made of ferromagnetic material having a magnetization direction that is constrained or "fixed". The modulating layer 160 can tune stray field generated on the MTJ stack 134 to influence switching threshold. The modulating layer 160 can be tuned by thickness and compositions according to applications. In one embodiment, the modulating layer 160 may comprise nickel cobalt stack where nickel layers and cobalt layers one stacked above another, or palladium cobalt stack, or platinum cobalt stack. In some alternative embodiments, the modulating layer 160 may comprise a second pair of pinning layers including a third pinning layer 160a and a fourth pinning layer 160b. The second pair of pinning layers including a third pinning layer 160a and a fourth pinning layer 160b have opposite magnetization directions that one has a magnetization direction aligned and paralleled with the magnetization direction of the reference layer 170 while the other has a magnetization direction aligned and anti-paralleled with the magnetization direction of the reference layer 170. Using the same example given above, the third pinning layer 160a may have the "down" magnetization direction. The fourth pinning layer may 160b have the "up" magnetization direction. As an example, the third pinning layer 160a may comprise nickel layers and cobalt layers one stacked above another $(Ni/Co)_q$, or palladium cobalt stack $((Pd/Co)_q$, or platinum cobalt stack $(Pt/Co)_q$, where q can be a positive integer. The fourth pining layer 160b may comprise cobalt nickel stack $(Co/Ni)_s$. cobalt palladium stack $(Co/Pd)_s$, or cobalt platinum stack $(Co/Pt)_s$, where s can be a positive integer, and q can be greater than s.

The modulating layer 160 may also be configured to be magnetically coupled to the free layer 166 and reinforce stability of the free layer 166. A net stray field is exerted on the free layer 166 by the magnetizations of the reference layer 170, the SyAF layer 172, and the modulating layer 160. The reference layer 170, the SyAF layer 172, and the modulating layer 160 are designed by adjusting material, thickness, and depositions such that the net stray field exerted on the free layer 166 is zero or negligible. Thereby, the P (parallel)-state and the AP (anti-parallel)-state of the magnetic memory device 100 are balanced and both stabilized. A net stray field is also exerted on the reference layer 170 by the magnetizations of the free layer 166, the SyAF layer 172, and the modulating layer 160. The free layer 166, the SyAF layer 172, and the modulating layer 160 are designed by adjusting material, thickness, and depositions such that the net stray field exerted on the reference layer 170 is zero or in the same direction of the intrinsic magnetization direction of the reference layer 170. Thereby, a backstitching issue can be eliminated or at least reduced.

Figure 2A:
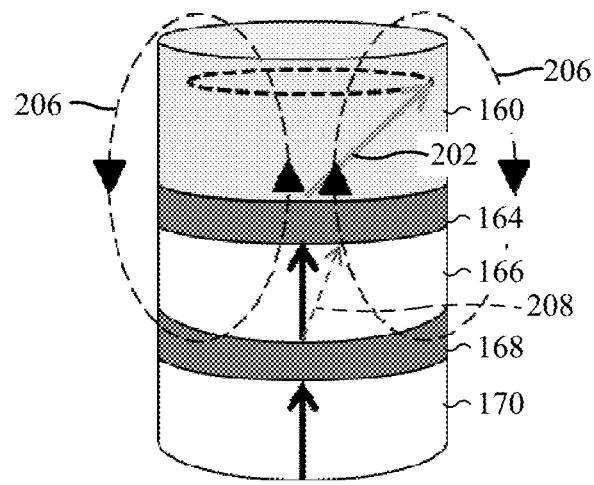
FIGS. 2A and 2B illustrate schematic diagrams of the magnetic memory device of FIG. 1 showing a magnetic effect of the modulating layer according to some embodiments.
Figure 2B:
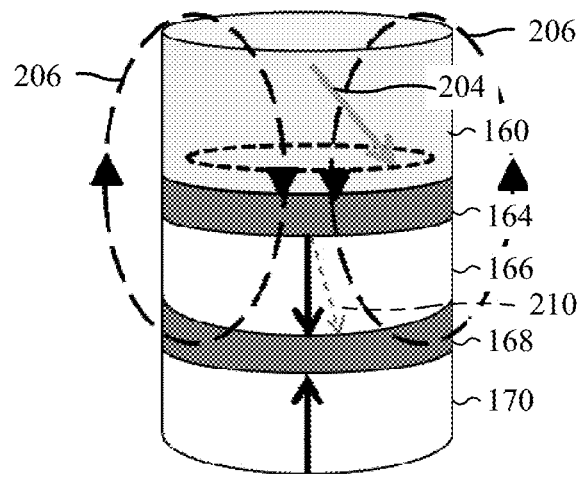

In some further alternative embodiments, the modulating layer 160 may comprise one or more freer-switching magnetic layers that are loosely coupled with the free layer 166. FIGS. 2A and 2B illustrate schematic diagrams of the magnetic memory device 100 of FIG. 1 showing a magnetic effect of the modulating layer 160 according to some embodiments. The MTJ stack is in the lower resistance P state in FIG. 2A and the higher resistance AP state in FIG. 2B. The modulating layer 160 reduces the incubation time by providing an initial angle and enhances stability by magnetic coupling to the free layer 166 and the reference layer 170. The modulating layer 160 is designed without clear easy axis as shown by arrows 202 and 204, and is magnetically coupled to the free layer 166 as shown by break-lined arrows 206. Thus, the magnetization direction of the modulating layer 160 can stay unaligned with an easy axis of the free layer 166 (which is perpendicular in this example), inducing non-zero initial angle in the free layer 166 as shown by arrows 206 and 208. Thereby, incubation time is reduced and so is the pulse width for switching. Also, the magnetic coupling between the free layer 166 and the modulating layer 160 reinforces the stability of the free layer 166. As examples, the modulating layer 160 may comprise $Co_{80}Ir_{20}$ or $NiFe_2O_4$.

Referring back to FIG. 1, in some further alternative embodiments, the modulating layer 160 may comprise one or more metal or dielectric layers to tune total resistance of the magnetic memory device 100 and control the voltage or current across the MTJ stack 134.

In addition, a selector layer 174 may be disposed between the bottom electrode 132 and the SyAF layer 172. The selector layer 174 is configured to switch current on and off based on applied bias. In some embodiments, the selector layer 174 comprises materials such as nickel chromium (NiCr), cobalt iron boron (CoFeB), magnesium (Mg), and/or tantalum (Ta). The selector layer itself can compose of multi-layers, by materials such as oxide semiconductor, Mo, Ag, TiN, and heavy metal such as Pt, Pd, Ir, Ru.

In an alternative implementation, the MTJ stack 134 can be vertically "flipped", such that the SyAF layer 172 and the reference layer 170 are disposed over the free layer 166 and the modulating layer 160 in the stated order from top to bottom.

In some embodiments, an access transistor 234 is coupled to the MTJ stack 134 by a lower metal layer 128 disposed under a bottom electrode 132. A bit line (BL) is coupled to one end of the MTJ stack 134 through a top electrode 136 disposed under a upper metal layer 152, and a source line (SL) is coupled to an opposite end of the MTJ stack 134 through the access transistor 234. Thus, application of a suitable word line (WL) voltage to a gate electrode of the access transistor 234 couples the MTJ stack 134 between the BL and the SL. Consequently, by providing suitable bias conditions, the MTJ stack 134 can be switched between the first state with a low resistance and the second state with a high resistance to store data.

Figure 3A:
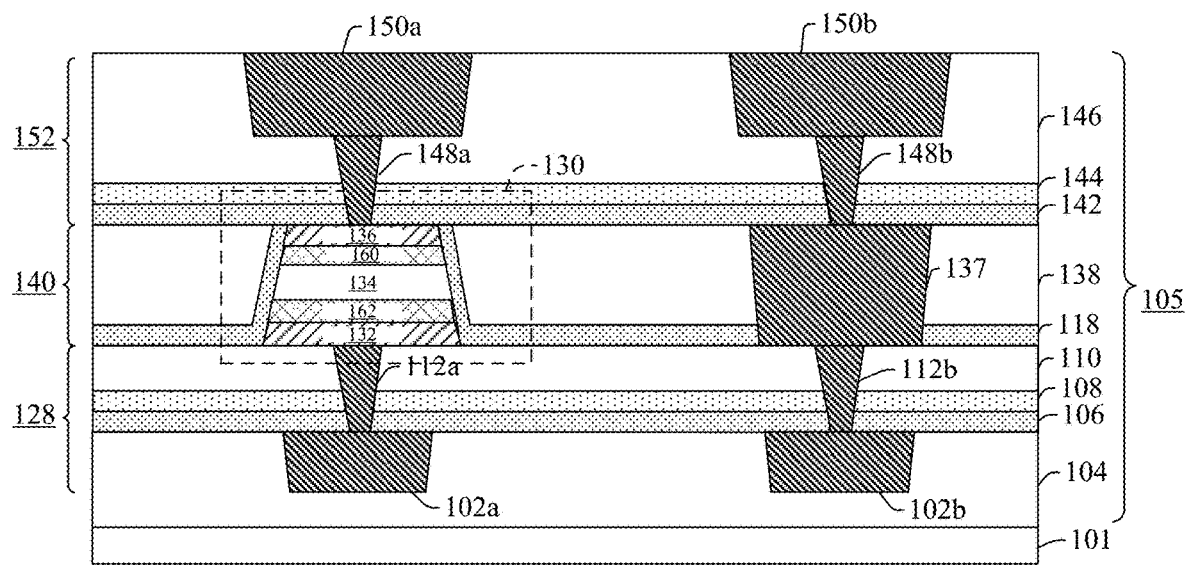
FIG. 3A illustrates a cross-sectional view of an integrated circuit including a MTJ stack including a modulating layer according to some alternative embodiments.
Figure 3B:
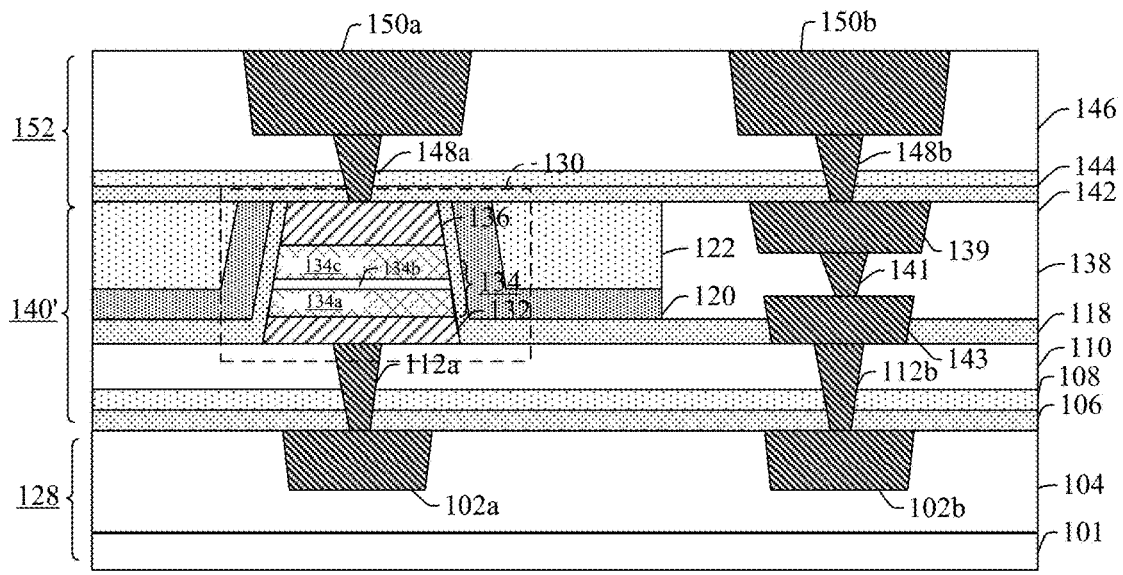
FIG. 3B illustrates a cross-sectional view of an integrated circuit including a MTJ stack including a modulating layer according to some alternative embodiments.

FIG. 3A and FIG. 3B respectively show cross-sectional views of integrated circuits (ICs) 300a and 300b disposed over a substrate 101 according to some embodiments. As shown in FIG. 3A and FIG. 3B, an interconnect structure 105 is disposed over the substrate 101. In some embodiments, the interconnect structure 105 comprises a lower metal layer 128 surrounded by a lower inter-layer dielectric (ILD) layer 104 and an upper metal layer 152 surrounded by an upper ILD layer 146. The lower metal layer 128 and the upper metal layer 152 may comprise copper. The lower metal layer 128 comprises a plurality of lower metal lines laterally aligned one another, such as a first lower metal line 102a and a second lower metal line 102b at. The lower metal layer 128 further comprises a plurality of lower metal vias disposed over the lower metal lines, such as a first lower metal via 112a coupled to the first lower metal line 102a and a second lower metal via 112b coupled to the second lower metal line 102b. In some embodiments, a lower etch stop layer 106 and/or a protective liner 108 are disposed directly along upper surfaces of the lower metal lines 102a, 102b and the lower ILD layer 104. A lower low-k dielectric layer 110 is disposed over the protective liner 108 having an upper surface aligned with top surfaces of the lower metal vias 112a, 112b. The lower etch stop layer 106 may comprise silicon carbide, silicon nitride or combination thereof. The protective liner 108 may comprise dielectric material such as TEOS (Tetraethyl Orthosilicate). The upper metal layer 152 overlies the lower metal layer 128 and the lower ILD layer 104. The upper metal layer 152 may comprise a plurality of upper metal lines laterally aligned one another, such as a first upper metal line 150a and a second upper metal line 150b. A plurality of upper metal vias are respectively coupled to the plurality of upper metal lines, including a first upper metal via 148a coupled to the first upper metal line 150a and a second upper metal via 148b coupled to the second upper metal line 150b. In some embodiments, an upper etch stop layer 142 and/or a protective liner 144 are disposed surrounding a lower portion of the upper metal vias 148a, 148b. A tuned magnetic module 130 is disposed between the first lower metal via 112a and the first upper metal via 148a. In some embodiments, the tuned magnetic module 130 may have a structure similar or same with the tuned magnetic module 130 shown in FIG. 1. As already illustrated with reference to FIG. 1, the tuned magnetic module 130 is designed according to specific applications from a tunable magnetic module using the modulating layer 160 and/or the selector layer 174 to adjust electrical characteristics of the MTJ stack 134 such as resistance, switching threshold, switching pulse width, etc.

In some embodiments, referring to FIG. 3A, an intermediate metal layer 140 is disposed between the upper metal layer 152 and the lower metal layer 128. The intermediate metal layer 140 comprises an intermediate metal line 137 abutting the second upper metal via 148b and the second lower metal via 112b and having a height substantially equal to a height of the tuned magnetic module 130. In alternative embodiments, referring to FIG. 3B, multiple intermediate metal layers 140' are disposed between the upper metal layer 152 and the lower metal layer 128. For example, a first intermediate metal line 139 and a second intermediate metal line 143 are disposed between the second upper metal via 148b and the second lower metal via 112b and connected by an intermediate metal via 141. By incorporating the tuned magnetic module 130 to cross one or more intermediate metal layers, dimensions of memory cells, metal layers, and ILD layers can be flexibly designed and not limited by one another.

Figure 4:
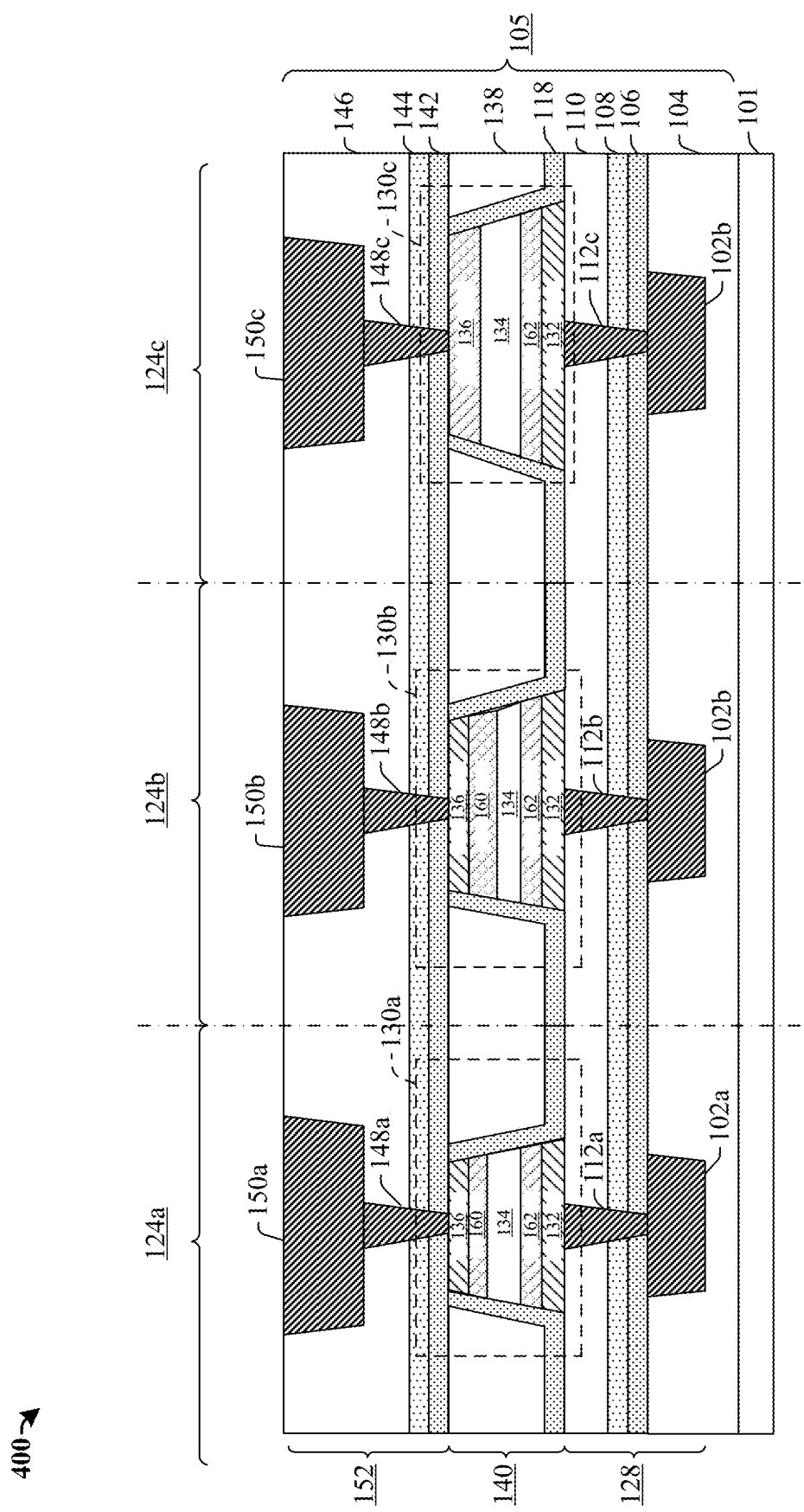
FIG. 4 illustrates a cross-sectional view of an integrated circuit including a plurality of magnetic memory devices with different compositions or dimensions according to some embodiments.

FIG. 4 shows a cross-sectional view of an integrated circuit 400 including a plurality of magnetic memory devices (e.g. 124a, 124b, 124c) with different compositions or dimensions according to some embodiments. Similar as shown in FIG. 3A and FIG. 3B, the plurality of magnetic memory devices (e.g. 124a, 124b, 124c) is inserted in the interconnect structure 105 between the upper metal layer 152 and the lower metal layer 128 within one or more intermediate metal layers. Though the magnetic memory devices 124a, 124b, 124c are shown as inserted within the same intermediate metal layer 140, it is understood that the plurality of magnetic memory devices can be arranged within one or more different metal layers. An example of two magnetic memory devices arranged within two separate metal layers is shown later in FIG. 5. The plurality of magnetic memory devices is tuned to have varied compositions or dimensions for different functional optimizations. For example, a first magnetic memory device 124a may comprise an array of first tuned magnetic modules 130a for low current and high speed by having a relative small lateral dimension and a relative thick, well-crystallized tunneling barrier layer to increase spin-transfer torque efficiency. The first magnetic memory device 124a may be used for a core cache or a shared cache for a computer system, which currently uses a SRAM memory. A second magnetic memory device 124b may comprise an array of second tuned magnetic modules 130b to replace functions of current DRAM memory to be used as an on-package memory for the computer system, for example. The lateral dimension is greater than the first magnetic memory device 124a, and correspondingly the current is increased and the speed is reduced compared to the first magnetic memory device 124a. The modulating layer disclosed above can be used in the first magnetic memory device 124a and the second magnetic memory device 124b for turning tuning the electrical characters of the devices. A third magnetic memory device 124c may comprise an array of third tuned magnetic modules 130c to replace functions of current flash memory and have an enhanced retention. The third magnetic memory device 124c may have a lateral diameter greater than the first magnetic memory device 124a and the second magnetic memory device 124b. A free layer of a MTJ stack of the third magnetic memory device 124c is tuned to increase the total magnetization, for example, by using a material having a large saturated magnetization and/or increase the volume of the free layer. The third magnetic memory device 124c may be absent of the switching threshold modulating layer.

Figure 5:
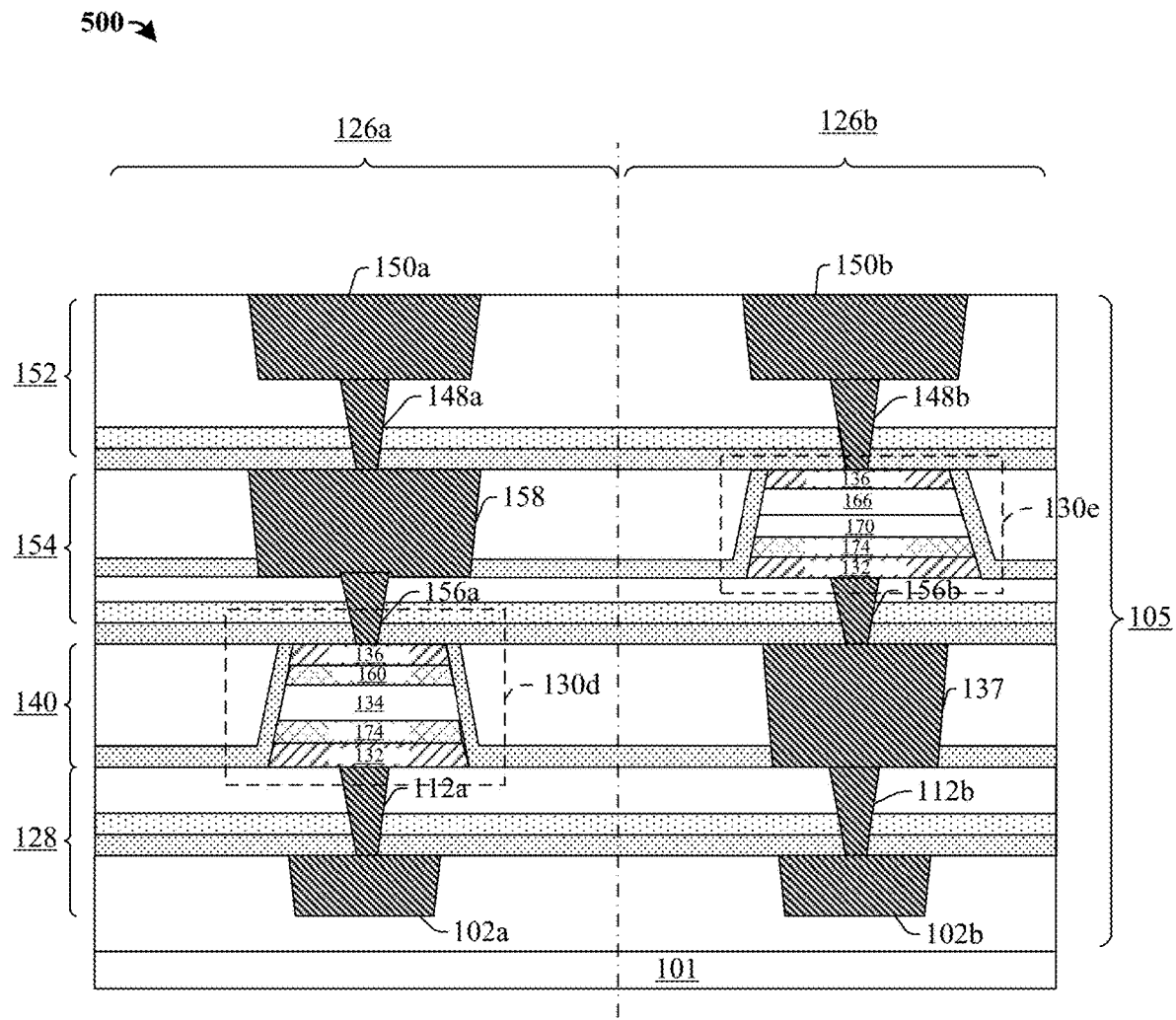
FIG. 5 illustrates a cross-sectional view of an integrated circuit including a plurality of magnetic memory devices inserted between different metal layers of the interconnect structure.

FIG. 5 shows a cross-sectional view of an integrated circuit 500 including a plurality of magnetic memory devices (e.g. 126a, 126b) inserted between different metal layers of an interconnect structure 105. Similar as shown in FIG. 3A and FIG. 3B, the plurality of magnetic memory devices (e.g. 126a, 126b) is inserted in the interconnect structure 105 between the upper metal layer 152 and the lower metal layer 128 within one or more intermediate metal layers. The magnetic memory devices 126a, 126b are shown as inserted within different intermediate metal layers 140, 154. A first magnetic memory device 126a is inserted within a first intermediate metal layer 140 between a metal line 158 of a second intermediate metal layer 154 and a first lower metal line 102a of the lower metal layer 128 and electrically coupled by the metal vias 112a and 156a. A second magnetic memory device 126b is inserted within the second intermediate metal layer 154 between a metal line 150b of the upper metal layer 152 and a metal line 137 of the first intermediate metal layer 140 and electrically coupled by the metal vias 156b and 148b. Each of the plurality of magnetic memory devices 126a, 126b can also be arranged across multiple intermediate metal layers as shown in FIG. 3B. The plurality of magnetic memory devices 126a, 126b can be tuned to have varied compositions or dimensions for different functional optimizations. Besides replacing SRAM, DRAM, or flash memory as described above with reference to FIG. 4, the tunable magnetic modules can also be tuned to be used as other circuit components. FIG. 5 shows another two examples of tuned magnetic modules 130d, 130e. A fourth tuned magnetic module 130d can function as a high resistance component by having a smaller lateral dimension and/or a thicker tunneling barrier layer compared to the tuned magnetic modules 130a-130c described above. Also, the selector layer 174 can be arranged to have a low and stable on-current. A fifth tuned magnetic module 130e can function as a header/footer switch component and have small on-resistance and small magnetoresistance. The fifth tuned magnetic module 130e may have small dimension and absenting tunneling barrier layer compared to the tuned magnetic modules 130a-130c described above. Also, the selector layer 174 for module 130e can be selected to have a desired switching threshold.

Figure 6:
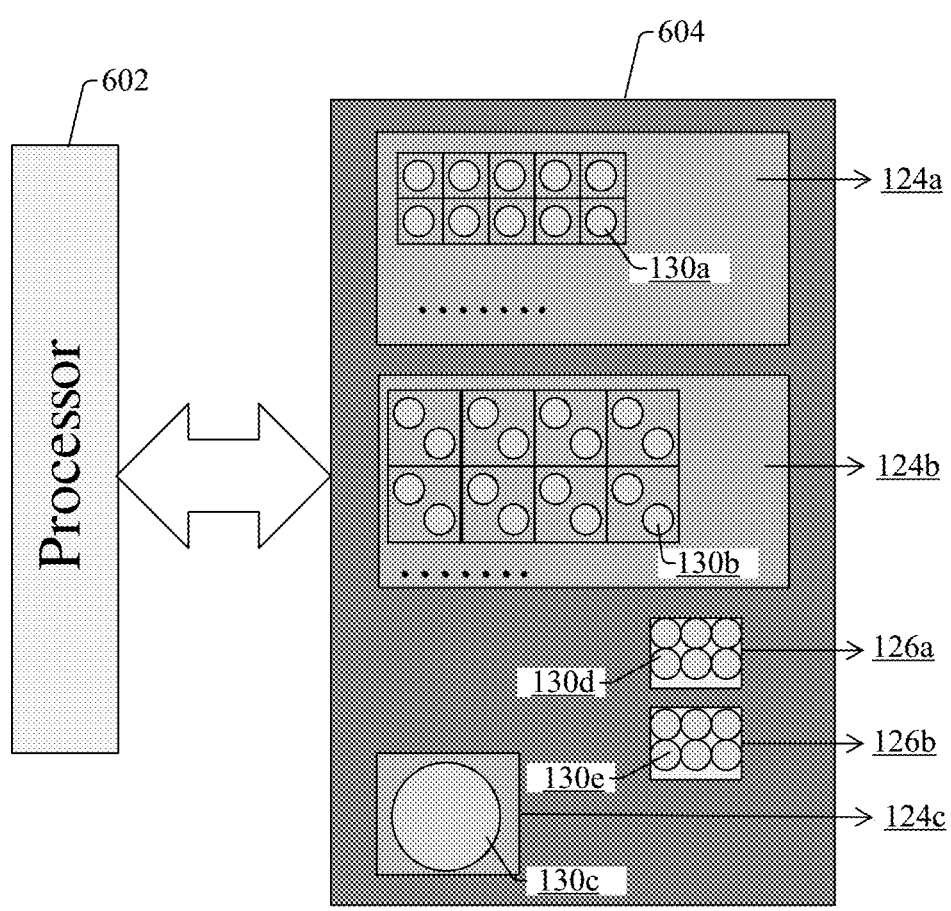
FIG. 6 illustrates a schematic diagram of an integrated circuit package including an integrated system chip including magnetic memory devices according to some embodiments.

FIG. 6 shows a schematic diagram of an integrated circuit package 600 including a processor chip 602 and an integrated system chip 604 packaged together according to some embodiments. The integrated system chip 604 includes magnetic memory devices 124a, 124b, 124c, 126a, and 126b integrated in one substrate. CMOS logic devices can be integrated within the substrate. The magnetic memory devices 124a, 124b, 124c, 126a, and 126b respectively comprises a plurality of tuned magnetic modules 130a, 130b, 130c, 130d, and 130e. The tuned magnetic modules 130a, 130b, 130c, 130d, and 130e are made from a tunable magnetic module by adjusting dimensions and compositions. Examples of the tuned magnetic modules 130a, 130b, 130c, 130d, and 130e are shown associated with FIG. 4 and FIG. 5. A first magnetic memory device 124a may comprise an array of first tuned magnetic modules 130a for low current and high speed by having a relative small lateral dimension and a relative thick, well-crystallized tunneling barrier layer. The first magnetic memory device 124a may be used for a core cache or a shared cache for a computer system, which currently uses a SRAM memory. A second magnetic memory device 124b may comprise an array of second tuned magnetic modules 130b to replace functions of current DRAM memory to be used as an on-package memory for the computer system, for example. The lateral dimension of the second tuned magnetic modules 130b is greater than the first tuned magnetic modules 130a, and correspondingly the current is increased and the speed is reduced compared to the first magnetic memory device 124a. The modulating layer can be used in the first magnetic memory device 124a and the second magnetic memory device 124b for turning tuning the electrical characters of the devices. A third magnetic memory device 124c may comprise an array of third tuned magnetic modules 130c to replace functions of current flash memory and have an enhanced retention. The third tuned magnetic modules 130c may have a lateral diameter greater than the first tuned magnetic modules 130a and the second tuned magnetic modules 130b. A free layer of a MTJ stack of the third tuned magnetic modules 130c is tuned to increase the total magnetization, for example, by using a material having a large saturated magnetization and/or increase the volume of the free layer. The third tuned magnetic modules 130c may be absent of the switching threshold modulating layer. A fourth magnetic memory device 126a includes a plurality of fourth magnetic module 130d. The fourth tuned magnetic module 130d can function as a high resistance component by having a smaller lateral dimension and/or a thicker tunneling barrier layer compared to the tuned magnetic modules 130a-130c described above. Also, the selector layer can be arranged to have a low and stable on-current. A fifth magnetic memory device 126b includes a plurality of fifth magnetic module 130e. The fifth tuned magnetic module 130e can function as a header/footer switch component and have small on-resistance and small magnetoresistance. The fifth tuned magnetic module 130e may have small dimension and absenting tunneling barrier layer compared to the tuned magnetic modules 130a-130c described above. Also, the selector layer can be selected to have a desired switching threshold. The magnetic memory devices 124a, 124b, 124c, 126a, and 126b can be inserted within the same intermediate metal layer of an interconnect structure. Alternatively, the magnetic memory devices 124a, 124b, 124c, 126a, and 126b can also be inserted within multiple different intermediate metal layers of the interconnect structure. The interconnect structure can be a back end of line structure of the integrated system chip 604.

Figure 7:
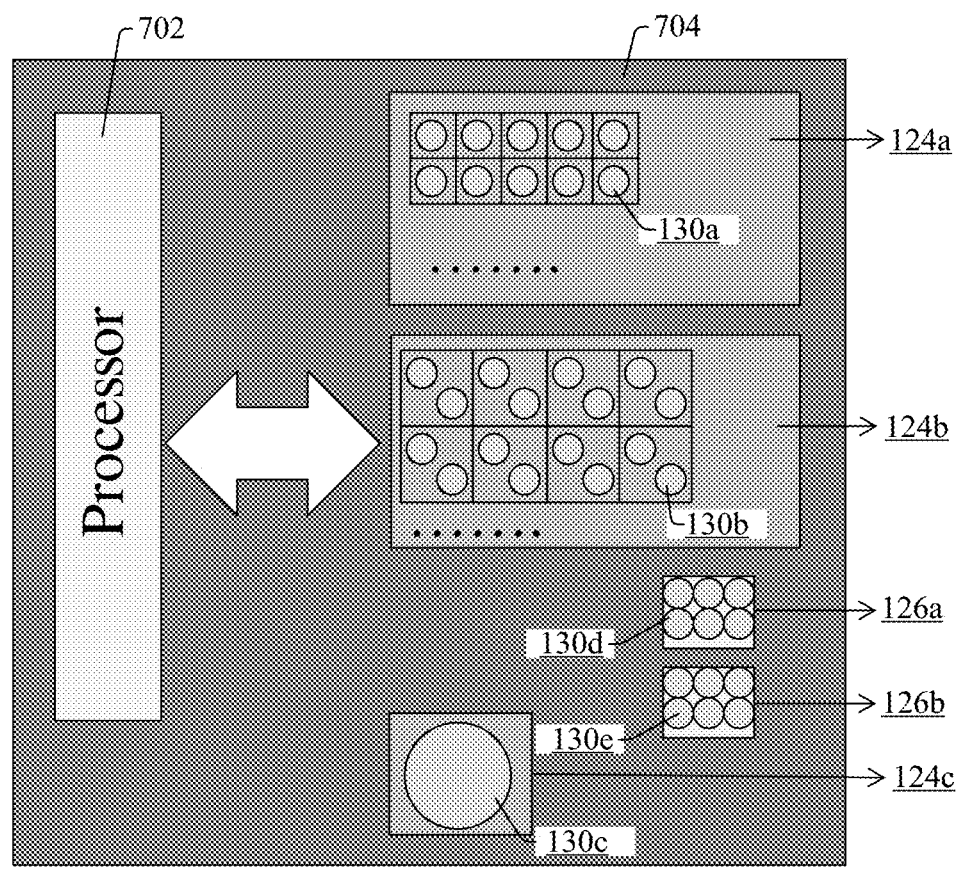
FIG. 7 illustrates a schematic diagram of an integrated circuit package including an integrated system chip including magnetic memory devices according to some alternative embodiments.

FIG. 7 illustrates a schematic diagram of an integrated circuit package 700 including an integrated system chip 704 including a plurality of magnetic memory devices according to some alternative embodiments. Compared to FIG. 6, the processor 702 can be integrated in one integrated system chip 704 with the magnetic memory devices 124a, 124b, 124c, 126a, and 126b in one substrate. CMOS logic devices can be integrated within the substrate.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In some embodiment, the present disclosure relates to magnetic memory device. The magnetic memory device includes a bottom electrode, a selector layer disposed over the bottom electrode, and a MTJ stack disposed over the selector layer and comprising a reference layer and a free layer disposed over the reference layer and separated from the reference layer by a tunneling barrier layer. The magnetic memory device further includes a modulating layer disposed over the MTJ stack and a top electrode disposed over the switching threshold modulating layer. The selector layer is configured to switch current on and off based on applied bias.

In another embodiment, the present disclosure relates to an integrated system chip. The integrated system chip includes a substrate and a lower metal layer disposed over the substrate. The lower metal layer comprises a first lower metal line within a first region and a second lower metal line within a second region. The integrated system chip further includes an upper metal layer overlying the lower metal layer and comprising a first upper metal line within the first region and a second upper metal line within the second region. The integrated system chip further includes a first magnetic memory device disposed between the first lower metal line and the first upper metal line and a second magnetic memory device disposed between the second lower metal line and the second upper metal line. The first magnetic memory device and the second magnetic memory device have different lateral dimensions.

In yet another embodiment, the present disclosure relates to an integrated system chip. The integrated system chip includes a substrate and an interconnect structure disposed over the substrate. The interconnect structure comprises a plurality of metal layers each comprising a plurality of leveled horizontal metal lines. The interconnect structure includes a lower metal layer disposed over the substrate, an intermediate metal layer disposed over the lower metal layer, and an upper metal layer overlying the intermediate metal layer. The integrated system chip further includes a first magnetic memory device disposed between the lower metal layer and the intermediate metal layer and a second magnetic memory device disposed between the intermediate metal layer and the upper metal layer. The first magnetic memory device and the second magnetic memory device have different vertical thicknesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory device, comprising:
   a bottom electrode;
   a selector layer disposed over the bottom electrode;
   a MTJ stack disposed over the selector layer and comprising a reference layer and a free layer disposed over the reference layer;
   a modulating layer disposed over the MTJ stack; and
   a top electrode disposed over the modulating layer;
   wherein the reference layer and the free layer are in direct contact with one another.

2. The magnetic memory device of claim 1, wherein the modulating layer is configured to modulate a switching threshold of the MTJ stack through magnetic or electrical interactions.

3. The magnetic memory device of claim 1, wherein the modulating layer is configured to reinforce stability of the free layer by magnetically coupled to the free layer.

4. The magnetic memory device of claim 1, wherein the modulating layer comprises a stack of cobalt layers and platinum layers one stacked on another, or a stack of cobalt layers and nickel layers one stacked on another.

5. The magnetic memory device of claim 1, wherein the modulating layer comprises $Co_{80}Ir_{20}$ or $NiFe_2O_4$.

6. The magnetic memory device of claim 1, wherein the modulating layer is magnetically coupled to the free layer.

7. An integrated system chip, comprising:
a substrate;
a lower metal layer disposed over the substrate, and comprising a first lower metal line within a first region and a second lower metal line within a second region;
an upper metal layer overlying the lower metal layer, and comprising a first upper metal line within the first region and a second upper metal line within the second region;
a first magnetic memory device disposed between the first lower metal line and the first upper metal line; and
a second magnetic memory device disposed between the second lower metal line and the second upper metal line;
a high resistance device disposed between a third lower metal line and a third upper metal line;
wherein the high resistance device has a lateral dimension smaller than the first magnetic memory device and the second magnetic memory device.

8. The integrated system chip of claim 7, wherein the first magnetic memory device and the second magnetic memory device have the same vertical thickness.

9. The integrated system chip of claim 7, wherein the first magnetic memory device comprises a first selector layer disposed over the first lower metal line, a first MTJ stack disposed over the first selector layer, and a first modulating layer disposed over the first MTJ stack.

10. The integrated system chip of claim 9,
wherein the second magnetic memory device comprises a second MTJ stack disposed over a second selector layer, and a second modulating layer disposed over the second MTJ stack;
wherein the second modulating layer has a different composition than that of the first modulating layer.

11. The integrated system chip of claim 10, wherein the second MTJ stack has the same composition and thickness as the first MTJ stack.

12. The integrated system chip of claim 9,
wherein a modulating layer is absent from the second magnetic memory device;
wherein a second MTJ stack of the second magnetic memory device has a vertical thickness greater than that of the first MTJ stack.

13. The integrated system chip of claim 7,
wherein the first magnetic memory device comprises a first reference layer and a first free layer vertically separated by a first tunneling barrier layer;
wherein the second magnetic memory device comprises a second reference layer and a second free layer in direct contact with one another.

14. The integrated system chip of claim 7,
wherein the high resistance device has a thicker tunneling barrier layer than that of the first magnetic memory device or the second magnetic memory device.

15. The integrated system chip of claim 7, further comprises:
an intermediate metal layer disposed between the lower metal layer and the upper metal layer.

16. An integrated system chip, comprising:
a substrate;
an interconnect structure disposed over the substrate and comprising a plurality of metal layers each comprising a plurality of leveled horizontal metal lines, wherein the interconnect structure includes a lower metal layer disposed over the substrate, an intermediate metal layer disposed over the lower metal layer, and an upper metal layer overlying the intermediate metal layer;
a first magnetic memory device disposed between the lower metal layer and the intermediate metal layer; and
a second magnetic memory device disposed between the intermediate metal layer and the upper metal layer;
wherein the first magnetic memory device and the second magnetic memory device have different vertical thicknesses.

17. The integrated system chip of claim 16, wherein the first magnetic memory device and the second magnetic memory device have different lateral dimensions.

18. The integrated system chip of claim 16, wherein the integrated system chip further comprises a header/footer switch device inserted in the interconnect structure.

19. The integrated system chip of claim 16, wherein the integrated system chip further comprises a high resistance device inserted in the interconnect structure.

20. The integrated system chip of claim 16, wherein the integrated system chip further comprises a CMOS logic circuit disposed within the substrate.

* * * * *